(12) United States Patent
Hu et al.

(10) Patent No.: US 8,436,092 B2
(45) Date of Patent: May 7, 2013

(54) GIANT MAGNETORESISTANCE COMPOSITE MATERIAL CONTAINING CARBON NANOTUBES

(75) Inventors: Chun-Hua Hu, Beijing (CN);
Chang-Hong Liu, Beijing (CN);
Shou-Shan Fan, Beijing (CN)

(73) Assignees: Tsinghua University, Beijing (CN);
Hon Hai Precision Industry Co., Ltd., New Taipei (TW)

( * ) Notice: Subject to any disclaimer, the term of this patent is extended or adjusted under 35 U.S.C. 154(b) by 488 days.

(21) Appl. No.: 12/584,464

(22) Filed: Sep. 3, 2009

(65) Prior Publication Data
US 2010/0181521 A1 Jul. 22, 2010

(30) Foreign Application Priority Data
Jan. 16, 2009 (CN) .......................... 2009 1 0105114

(51) Int. Cl.
*C08L 83/04* (2006.01)
(52) U.S. Cl.
USPC .......................................................... 524/588
(58) Field of Classification Search .................... 524/588
See application file for complete search history.

(56) References Cited

U.S. PATENT DOCUMENTS
2007/0295714 A1 12/2007 Liu et al.

FOREIGN PATENT DOCUMENTS
JP    2005-26320       1/2005
WO    WO2008143233    11/2008

OTHER PUBLICATIONS

Yung et al., 2008 $2^{nd}$ IEEE International Nanoelectronics Conference (2008) pp. 1198-1201.*
Giant Magnetoresistance of (001) Fe/(OOI) Cr Magnetic Superlattices,Phy. Rev. Lett., 1988, 61. 2472.
Recent Development of Research in Giant Magneto—Resistance Effects,China,Natural Sciences Journal of Harbin Normal University,2005.
Application of Carbon Nanotube in Magnetic Material,China,Journal of Hubei Polytechnic University,2004-4.

* cited by examiner

*Primary Examiner* — Kuo-Liang Peng
(74) *Attorney, Agent, or Firm* — Altis Law Group, Inc.

(57) ABSTRACT

A GMR material includes a polymer matrix and a plurality of carbon nanotubes. The plurality of carbon nanotubes are dispersed in such a manner that substantially none of the plurality of carbon nanotubes are in contact with each other.

18 Claims, 4 Drawing Sheets

GIANT MAGNETORESISTANCE COMPOSITE MATERIAL CONTAINING CARBON NANOTUBES

BACKGROUND

1. Technical Field

The present disclosure relates to a giant magnetoresistance material and, in particular, to a giant magneto-resistance composite material containing carbon nanotubes.

2. Discussion of the Related Art

Since the giant magnetoresistance (GMR) in metallic magnetic multilayers (M. N. Baibich et al., Phys. Rev. Lett. 61, 2472 (1988)) and later in immiscible magnetic granular alloys were discovered, it has aroused great interests in both theoretical and applied magnetism. GMR effect refers to a large resistance change of the GMR material when a magnetic field is applied to the GMR material at a certain temperature. Because it has tremendous practical value in the field of computer hard disk read heads, magnetic sensors and magnetic recording, GMR materials research and application development has become one of the hot spots in the current condensed matter physics and materials science.

The magnetoresistance (MR) of GMR material is given by the formula of:

$$MR = \frac{(\rho(H) - \rho(0))}{\rho(0)},$$

wherein $\rho(0)$ is a resistance under the magnetic field intensity equals to zero, $\rho(H)$ is the resistivity under nonzero magnetic field, respectively.

Traditional GMR material can be divided into two types. One is metallic magnetic multilayers. The other is the granular composite films with ferromagnetic grains embedded in insulating matrix.

A multilayer structure of metallic magnetic multilayers can be formed by the appropriate ferromagnet (such as Fe, Co, Ni) and non-ferromagnet (eg, Cu, Cr, Ar) overlapped with each other. Since the magnetocrystalline anisotropy, when applying a magnetic field to the metallic magnetic multilayers, its magnetization curve along the easy axis and hard axis is inconsistent. The MR of this kind of the GMR material reaches 10% at low temperatures (for example 4.2 Kelvin, equals minus 269 degrees Celsius). However, the MR need for the practical application of GMR materials is more than 5% at normal temperature. This kind of GMR material only at low temperatures has the GMR effect, which narrows the scope of their application. And the metallic magnetic multilayers are made of metal, which are difficult to cut and also limit their application.

The GMR effect has been widely explained by spin-dependent scattering theory. Subsequently, GMR was also observed in granular composite films with ferromagnetic grains embedded in insulating matrix. Different from the metallic magnetic multilayers mentioned above, this GMR was caused by spin-dependent tunneling, and so called tunneling magnetoresistance (TMR). The granular composite films are also made of metal, which is difficult to cut, also limits its application.

Carbon nanotubes (CNTs) are novel carbonaceous materials and received a great deal of interest since the early 1990s. Carbon nanotubes have interesting and potentially useful heat conducting, electrical conducting, and mechanical properties. Nowadays, a GMR material with carbon nanotubes is provided via sputtering Co—Zn—P, Co—Fe—P, Ni—Co—P or Ni—Zn—P on the surface of the carbon nanotubes. But this kind of GMR material is only available in a powdered form, which limits its application.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
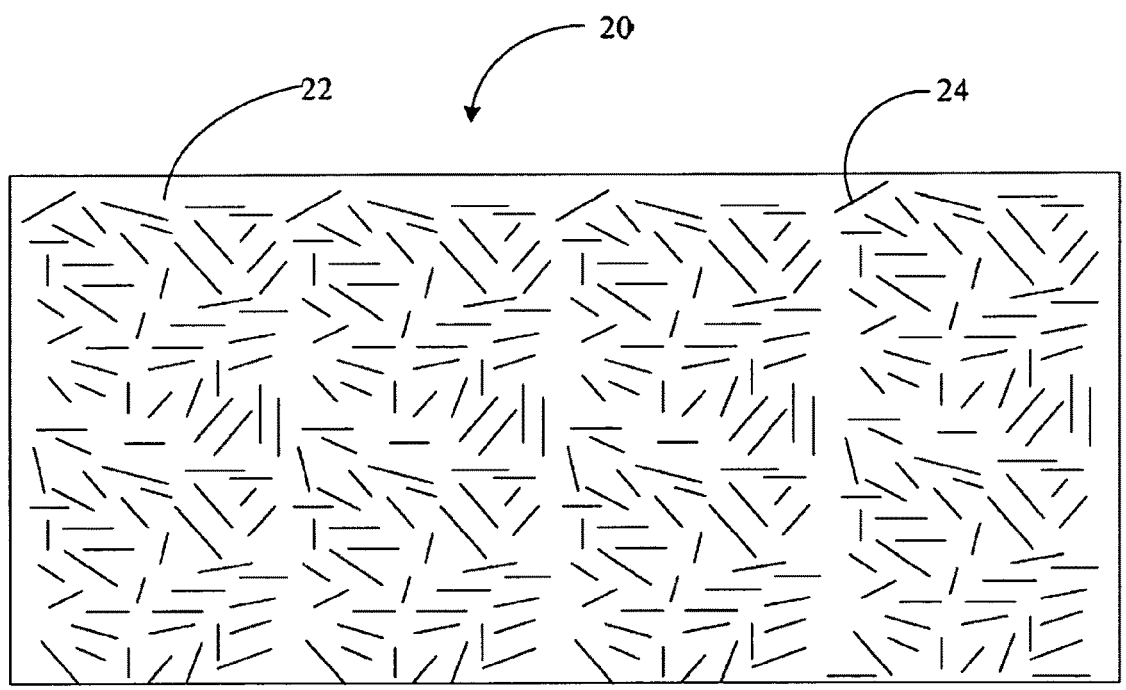
FIG. 1 is an isotropic view of a GMR composite material containing carbon nanotubes according to an exemplary embodiment.

Referring to FIG. 1, a GMR composite material 20 according to an embodiment is shown. The GMR composite material 20 includes a polymer matrix 22 and a plurality of carbon nanotubes 24. The carbon nanotubes 24 are distributed isotropicly and uniformly dispersed in the matrix 22. The more carbon nanotubes in contact within the polymer matrix 22, the worse the GMR effect of the GMR composite material 20. The carbon nanotubes 24 are independently disposed in the polymer matrix 22 such that the approximately none of the carbon nanotubes 24 will be in contact with each other. Therefore, they will not form a network in the polymer matrix 22. An average distance is defined between adjacent carbon nanotubes 24. In one embodiment, the average distance is in a range of about 2 nanometers to about 5 microns. In another embodiment, the average distance is in a range of about 50 nanometers to about 1 micron. Uniform dispersion and the less, if any, contact between any of the of the carbon nanotubes 24 in the polymer matrix 22 will provide a better GMR composite. The more isotropic the polymer matrix 22 is, more isotropic GMR characteristics the GMR composite material 20 will exhibit.

As a result of the high flexibility of the polymer matrix 22, the GMR composite material 20 also has high flexibility. A weight percentage of the polymer matrix 22 in the GMR composite material 20 ranges from about 98% to about 99.75%. The polymer matrix 22 may be made of polydimethylsiloxane (PDMS) composites, polyurethane, epoxy resin, polymethylmethacrylate, and the like. In one embodiment, the polymer matrix 22 is made of PDMS.

The carbon nanotubes 24 may have a weight percentage of the GMR composite material 20 in a range from about 0.25% to about 2%. The carbon nanotubes 24 each may have a length of about 1 μm to about 20 μm. The carbon nanotubes 24 can be single wall carbon nanotubes (SWCNTs), double wall carbon nanotubes (DWCNTs), and/or multi-wall carbon nanotubes (MWCNTs). The SWCNT may have a diameter of about 0.5 nm to about 10 nm. The DWCNT may have a diameter of about 1.0 nm to about 20 nm. And the MWCNT may have a diameter of about 1.5 nm to 50 nm. In one embodiment, the carbon nanotubes 24 are MWCNTs. The diameter of the MWCNT is in a range from about 10 nm to about 20 nm.

Figure 2:
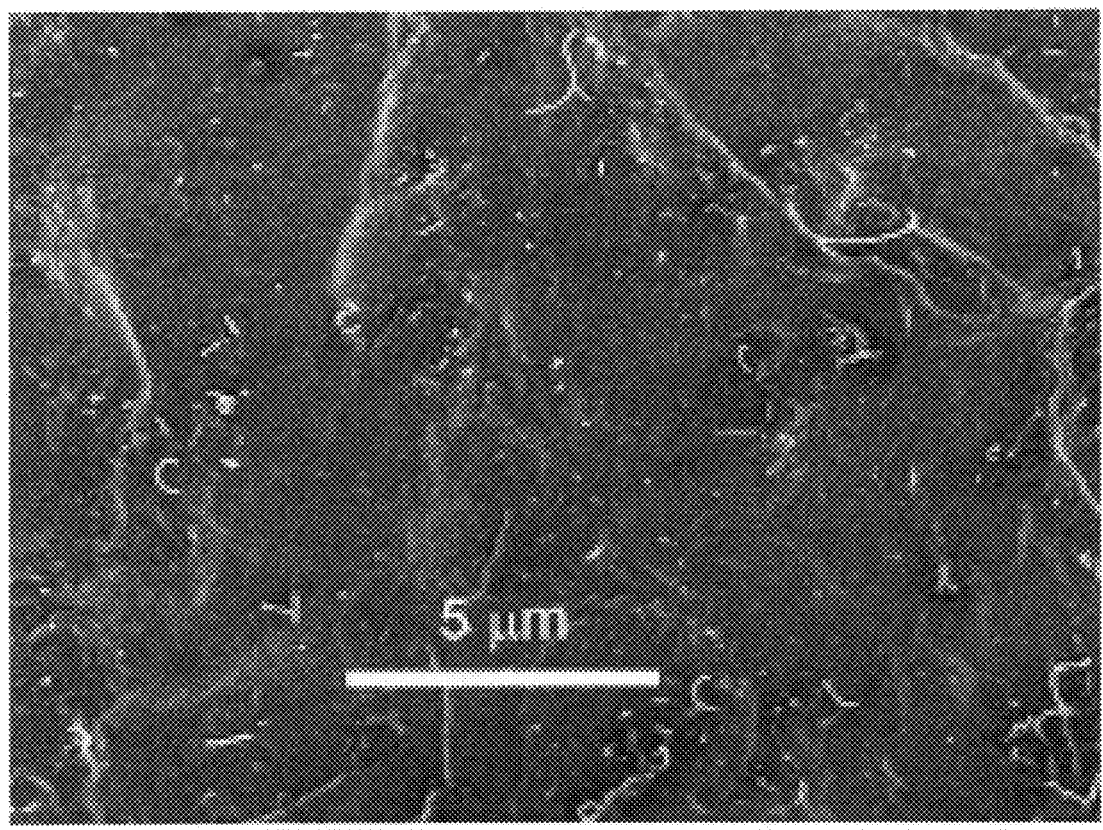
FIG. 2 is a scanning electron microscope (SEM) image of FIG. 1.

Referring to FIG. 2, in one embodiment, an SEM image of the GMR composite material 20 is shown. The SEM image shows that the carbon nanotubes are uniformly distributed in the PDMS matrix and independent of each other. In one embodiment, the GMR composite material 20 has a rectangular sheet configuration. The length of the GMR composite material 20 is 10 millimeters. The width of the GMR composite material 20 is 5 millimeters. The thickness of the GMR composite material 20 is 1 millimeter. The weight percentage of the carbon nanotubes 24 in the GMR composite material 20 is 0.55%.

Figure 3:
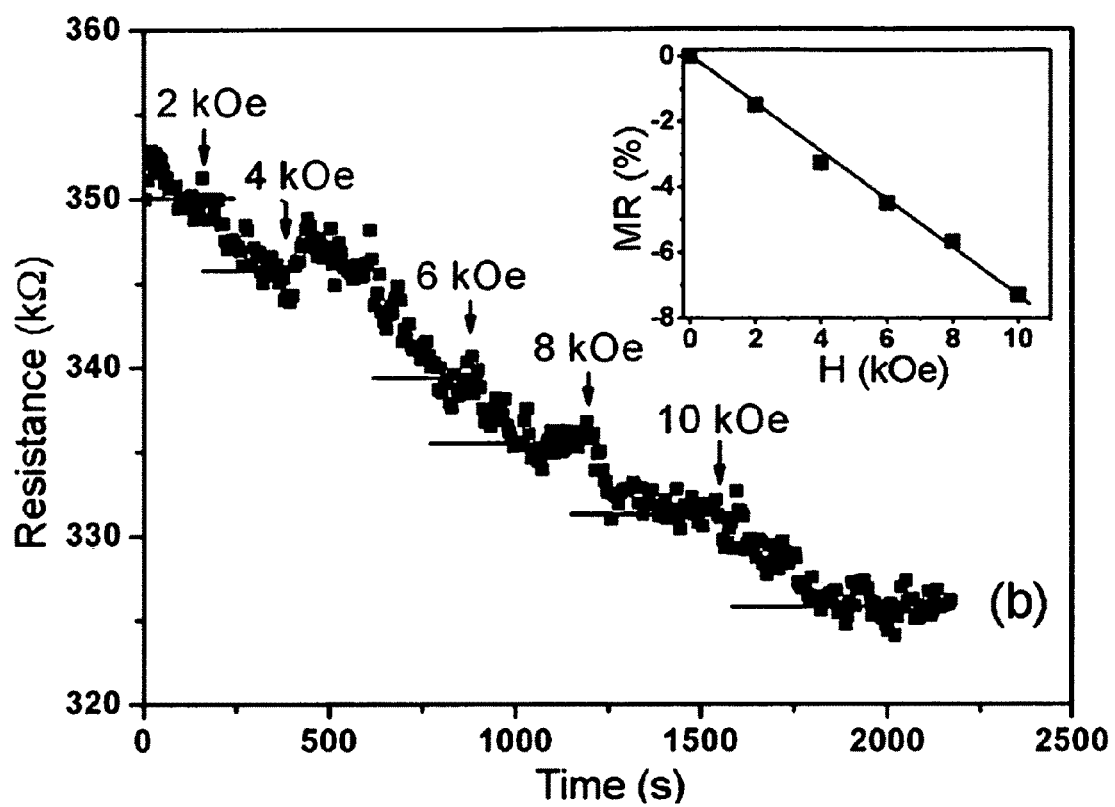
FIG. 3 is a graph illustrating resistance of the GMR composite material under different magnetic fields.

FIG. 3 shows the resistance of an embodiment of the GMR composite material 20 with 0.35 wt % carbon nanotubes at room temperature in magnetic field with a magnetic field intensity up to 10 kiloOersteds (kOe), and its MR is plotted in the inset. The magnetic field is applied in the direction perpendicular to the current. Little difference in MR is observed when the direction of the magnetic field parallel to the current is changed, which means the MR in this material is isotropic. The MR of the GMR composite material 20 is negative, and basically obeys a linear relationship with the magnetic field intensity up to 10 kOe (see the inset in FIG. 3). The resistance takes time to reach a stable value after the magnetic field is applied, which originates from the magnetic relaxation of PDMS. As discussed above, the weak diamagnetism of PDMS is favorable to the TMR. After the magnetic field is applied, the magnetization of PDMS needs time to reach a stable state, and thus so does the overall resistance.

Figure 4:
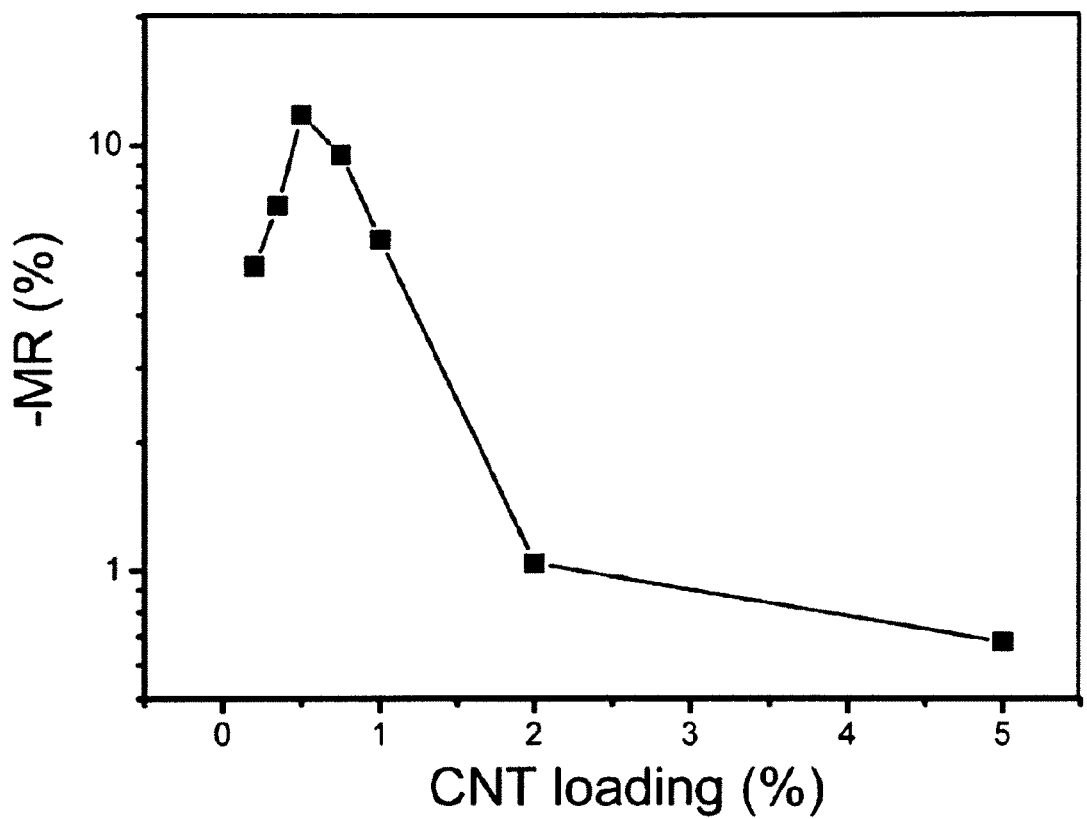
FIG. 4 shows the MR as a function of weight percentage of carbon nanotubes.

FIG. 4 shows the relationship between the MR of the GMR composite material and the weight percentage of the carbon nanotubes. All the resistances are measured under very small voltages (several to tens of millivolts) in order to eliminate the influences of high electric field and/or self-heating effect. All the samples display negative MR, and there exists a maximum value of MR located at a specific weight percentage of carbon nanotubes (around 0.50 wt % to 0.6 wt %).

As can be seen through FIG. 4, in the magnetic field intensity for 10 kOe, when the weight percentage of the carbon nanotubes 24 is less than 0.55%, the MR of the GMR composite materials 20 is increasing with the increase of the weight percentage of the carbon nanotubes 24. When the weight percentage of the carbon nanotubes 24 is greater than 0.55%, the MR of the GMR composite materials 20 decreases with increases in the weight percentage of the carbon nanotubes 24. The MR of the GMR composite materials 20 is 14% when the weight percentage of the carbon nanotubes 24 is 0.55%. In one embodiment, at room temperature, and the magnetic field intensity is 10 kOe, when the weight percentage of the carbon nanotubes 24 is in a range from about 0.2% to 1%, the MR of the GMR composite materials 20 is in a range from about 5% to about 14%. When the weight percentage of the carbon nanotubes 24 is in a range from about 0.4% to about 0.6%, the MR of the GMR composite materials 20 is in a range from about 10% to about 4%.

Because the polymer matrix 22 is easily cut, the GMR composite material 20 can be easily tailored to any size according to the application. Because the polymer matrix 22 has great flexibility, the GMR composite material 20 also has great flexibility and can be used in flexible devices. As the weight percentage of the carbon nanotubes 24 is in the range from about 0.25% to about 2%, the carbon nanotubes 24 can be distributed isotropicly and uniformly dispersed in the polymer matrix 22 and independent of each other. Since the carbon nanotubes 24 are independently disposed in the polymer matrix 22, and there is a average distance between any two adjacent carbon nanotubes 24, tunneling magnetoresistance (TMR) increases sharply in the GMR composite materials 20. Therefore the GMR composite materials 20 have an MR of about 10% at room temperature.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A giant magneto-resistance (GMR) material, comprising:
   a polymer matrix; and
   a plurality of carbon nanotubes dispersed in the polymer matrix; wherein the plurality of carbon nanotubes are dispersed in such a manner that substantially none of the plurality of carbon nanotubes are in contact with each other, an average distance is defined between adjacent carbon nanotubes, and the average distance is in a range from 50 nanometers to about 1 micron.

2. The GMR material as claimed in claim 1, wherein the polymer matrix is made of a flexible polymer.

3. The GMR material as claimed in claim 2, wherein the polymer matrix comprises of a material selected from the group consisting of polydimethylsiloxane, polyurethane, epoxy resin, polymethylmethacrylate, and any combinations thereof.

4. The GMR material as claimed in claim 1, wherein the carbon nanotubes are single wall carbon nanotubes, double wall carbon nanotubes, multi-wall carbon nanotubes or a combination thereof.

5. The GMR material as claimed in claim 1, wherein the carbon nanotubes have a weight percent of the GMR material in a range from about 0.2% to about 2%.

6. The GMR material as claimed in claim 1, wherein a weight percent of the carbon nanotubes is in a range from about 0.4% to about 0.6%.

7. The GMR material as claimed in claim 1, wherein none of the plurality of carbon nanotubes are in contact with each other.

8. An GMR material, comprising:
   a polymer matrix; and
   a plurality of carbon nanotubes dispersed in such a manner that approximately none of the plurality of carbon nanotubes are in contact with each other, wherein an average distance is in a range of about 1 micron to about 5 microns.

9. The GMR material as claimed in claim 8, wherein the polymer matrix is made of a flexible polymer.

10. The GMR material as claimed in claim 9, wherein the polymer matrix comprises of a material selected from the group consisting of polydimethylsiloxane, polyurethane, epoxy resin, polymethylmethacrylate, and any combinations thereof.

11. The GMR material as claimed in claim 8, wherein the carbon nanotubes are multi-wall carbon nanotubes.

12. The GMR material as claimed in claim 8, wherein there is an average distance defined between adjacent carbon nanotubes, and the average distance is in a range from about 10 nanometers to about 1 micron.

13. The GMR material as claimed in claim 8, wherein the carbon nanotubes have a weight percent of the GMR material in a range from about 0.2% to about 2%.

14. The GMR material as claimed in claim 8, wherein the carbon nanotubes have a weight percent of the GMR material in a range from about 0.4% to about 0.6%.

15. An GMR material, comprising:
a polymer matrix; and
a plurality of carbon nanotubes dispersed in such a manner that none of the plurality of carbon nanotubes are in contact with each other; wherein an average distance is defined between adjacent carbon nanotubes, the average distance is in a range from about 2 nanometers to about 5microns.

16. The GMR material as claimed in claim 15, wherein the polymer matrix is made of a flexible polymer.

17. The GMR material as claimed in claim 16, the polymer matrix comprises of a material selected from the group consisting of polydimethylsiloxane, polyurethane, epoxy resin, polymethylmethacrylate, and any combinations thereof.

18. The GMR material as claimed in claim 17, wherein the carbon nanotubes have a weight percent of the GMR material in a range from about 0.2% to about 2%.

\* \* \* \* \*